United States Patent
Bae et al.

(10) Patent No.: US 7,741,641 B2
(45) Date of Patent: Jun. 22, 2010

(54) TFT SUBSTRATE AND DISPLAY DEVICE HAVING THE SAME

(75) Inventors: Yang-Ho Bae, Suwon-si (KR); Chang-Oh Jeong, Suwon-si (KR); Min-Seok Oh, Yongin-si (KR); Je-Hun Lee, Seoul (KR); Beom-Seok Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 340 days.

(21) Appl. No.: 11/371,057

(22) Filed: Mar. 8, 2006

(65) Prior Publication Data

US 2006/0205125 A1    Sep. 14, 2006

(30) Foreign Application Priority Data

Mar. 9, 2005   (KR) .................. 10-2005-0019678

(51) Int. Cl.
*H01L 29/43* (2006.01)
*H01L 29/786* (2006.01)

(52) U.S. Cl. ............... 257/59; 257/61; 257/E29.151; 257/E29.291; 257/E21.414; 438/158

(58) Field of Classification Search ............ 438/158; 257/57, 59, 61, E29.151, E29.291, E21.412, 257/E21.414
See application file for complete search history.

(56) References Cited

U.S. PATENT DOCUMENTS 5,279,980 A * 1/1994 Hikichi et al. ............. 438/158
5,943,559 A * 8/1999 Maeda ..................... 438/149
5,976,902 A * 11/1999 Shih ......................... 438/30
5,998,229 A * 12/1999 Lyu et al. ................... 438/30
6,524,876 B1 * 2/2003 Baek et al. .................. 438/48
6,555,409 B2 * 4/2003 Kim et al. ................... 438/34
6,586,286 B2 * 7/2003 Park et al. ................. 438/155
6,620,655 B2 * 9/2003 Ha et al. .................... 438/149
6,933,568 B2 * 8/2005 Yang et al. ................. 257/347
7,129,105 B2 * 10/2006 Yoon et al. .................. 438/30
7,357,878 B2 * 4/2008 Park et al. .................. 216/91
7,371,621 B2 * 5/2008 Kim et al. .................. 438/149
7,492,427 B2 * 2/2009 Na ............................ 349/138
7,522,224 B2 * 4/2009 Hwang et al. ............... 349/38
7,537,974 B2 * 5/2009 Park et al. .................. 438/149
7,550,329 B2 * 6/2009 Jun et al. .................... 438/149

* cited by examiner

*Primary Examiner*—Mary Wilczewski
(74) *Attorney, Agent, or Firm*—Cantor Colburn LLP

(57) ABSTRACT

A TFT substrate includes a base substrate, a gate wiring formed on the base substrate, a gate insulation layer, an activation layer, an oxidation-blocking layer, a data wiring, a protection layer and a pixel electrode. The gate wiring includes a gate line and a gate electrode. The gate insulation layer is formed on the base substrate to cover the gate wiring. The activation layer is formed on the gate insulation layer. The oxidation-blocking layer is formed on the activation layer. The data wiring includes a data line, a source electrode and a drain electrode. The source and drain electrodes are disposed on the oxidation-blocking layer therefore lowering the on-current ($I_{on}$) for turning on the TFT and increasing the off-current ($I_{off}$) for turning off the TFT due to the oxidation-blocking layer.

11 Claims, 8 Drawing Sheets

TFT SUBSTRATE AND DISPLAY DEVICE HAVING THE SAME

This application claims priority to Korean Patent Application No. 2005-19678 filed on Mar. 9, 2005, and all the benefits accruing therefrom under 35 U.S.C. §119, and the contents of which in its entirety are herein incorporated by reference.

BACKGROUND OF THE INVENTION

1. Field of the Invention

The present invention relates to a thin film transistor substrate and a display device having the thin film transistor substrate. More particularly, the present invention relates to a thin film transistor substrate having a relatively low resistance wiring structure and a display device having the thin film transistor substrate.

2. Description of the Related Art

Generally, a thin film transistor ("TFT") substrate is used to control a pixel in a liquid crystal display ("LCD") device or an organic light emitting display ("OLED") device.

The TFT substrate includes a scan line (or gate line) for transferring a scan signal and a data line (or source line) for transferring an image signal. The TFT substrate further includes a TFT electrically connected to the scan line and the data line, a pixel electrode electrically connected to the TFT, a gate insulation layer that electrically insulates the gate line and a protection layer that electrically insulates the TFT and the data line.

The TFT includes a gate electrode, an activation layer, a source electrode, a data electrode, the gate insulation layer and the protection layer. The gate electrode extends from the scan line. The activation layer corresponds to a channel. The source and drain electrodes are formed through a metal layer forming the data line. The TFT corresponds to a switching device that applies the image signal to the pixel electrode, based on the scan signal provided from the scan line.

As a display device becomes larger and a resolution power becomes enhanced, the scan line and the data line become longer and narrower, so that an electrical resistivity and a parasitic capacitance increase, thereby inducing distortion of the scan and image signals, respectively.

As a result, aluminum (Al) used for a conventional display device is replaced by silver ("Ag") having lower electrical resistivity than that of aluminum. However, silver has a relatively weak adhesiveness with a glass substrate or a silicon layer, so that a silver wiring may easily separate from the glass substrate or the silicon layer, thus inducing a malfunction. Furthermore, silver is easily damaged by an etching solution used for etching the gate insulation layer.

In order to solve the above-mentioned problems, a wiring having a three-layered structure, including a silver layer disposed between two indium ("In") oxide layers, has been recently developed. However, oxygen from the indium oxide layers reacts with silicon in the activation layer of the TFT to form silicon oxide ("$SiO_2$"). The formation of the silicon oxide increases a required on-current ("$I_{on}$") for turning on the TFT and lowers a required off-current ("$I_{off}$") for turning off the TFT. Therefore, driving the TFT may become more difficult with the formation of the silicon oxide.

BRIEF SUMMARY OF THE INVENTION

The present invention provides a TFT substrate having a relatively low resistance wiring structure.

The present invention also provides a method of manufacturing the above-mentioned TFT substrate.

In an exemplary embodiment according to the present invention, the TFT substrate includes a base substrate, a gate wiring, a gate insulation layer, an activation layer, an oxidation-blocking layer, a data wiring, a protection layer and a pixel electrode. The gate wiring is formed on the base substrate. The gate wiring includes a gate line extended along a first direction and a gate electrode electrically connected to the gate line. The gate insulation layer is formed on the base substrate to cover the gate wiring. The activation layer is formed on the gate insulation layer. The oxidation-blocking layer is formed on the activation layer. The data wiring includes a data line extended along a second direction substantially perpendicular to the first direction, a source electrode electrically connected to the data line and a drain electrode separated from the source electrode. The source and drain electrodes are disposed on the oxidation-blocking layer. The protection layer covers the data wiring and has a contact hole exposing a portion of the drain electrode. The pixel electrode formed on the protection layer is electrically connected to the drain electrode through the contact hole.

In another exemplary embodiment according to the present invention, the TFT substrate includes a base substrate, a gate wiring, a gate insulation layer, an activation layer, a silicide layer, a data wiring, a protection layer and a pixel electrode. The gate wiring is formed on the base substrate. The gate wiring includes a gate line extended along a first direction and a gate electrode electrically connected to the gate line. The gate insulation layer is formed on the base substrate to cover the gate wiring. The activation layer is formed on the gate insulation layer. The silicide layer is formed on the activation layer. The data wiring includes a data line extended along a second direction substantially perpendicular to the first direction, a source electrode that is electrically connected to the data line and a drain electrode separated from the source electrode. The source and drain electrodes are disposed on the oxidation-blocking layer. The data wiring includes a first data wiring layer including indium oxide, a second data wiring layer formed on the first data wiring layer and a third data wiring layer formed on the second data wiring layer. For example, the second data wiring layer may be formed of silver, while the third data wiring layer may be formed of indium oxide. The protection layer covers the data wiring and has a contact hole exposing a portion of the drain electrode. The pixel electrode is formed on the protection layer and is electrically connected to the drain electrode through the contact hole.

According to yet another exemplary embodiment, a method of manufacturing a thin film transistor substrate includes forming a gate wiring on a base substrate. The gate wiring includes a gate line extended along a first direction and a gate electrode electrically connected to the gate line. A gate insulation layer is formed on the base substrate to cover the gate wiring. An activation layer is formed on the gate insulation layer. An oxidation-blocking layer is formed on the activation layer. A data wiring that includes a data line, a source electrode and a drain electrode is then formed. The data wiring is extended along a second direction substantially perpendicular to the first direction, the source electrode is electrically connected to the data line and the drain electrode is separated from the source electrode. The source and drain electrodes are disposed on the oxidation-blocking layer.

According to the present invention, the gate and data wirings have a three-layered structure having a first indium tin oxide layer, a silver layer formed on the first indium tin oxide layer, and a second indium tin oxide layer formed on the silver layer, thus lowering the electrical resistivity of the gate and data wirings.

Additionally, oxidation-blocking layer including silicide is formed between the ohmic contact layer and the data wiring, so that the on-current ("$I_{on}$") is lowered for turning the TFT on and the off-current ("$I_{off}$") is increased for turning the TFT off.

BRIEF DESCRIPTION OF THE DRAWINGS

The above and other features and advantages of the present invention will become more apparent by reference to the following detailed description when considered in conjunction with the accompanying drawings, in which:

FIGS. 3 through 10 are various plan views and cross-sectional views illustrating a process of manufacturing the exemplary TFT substrate in FIG. 2, wherein FIG. 3 is a plan view of gate wiring on the base substrate, the gate wiring includes gate lines and gate electrodes;

FIG. 4 is a partial cross-sectional view of the gate wiring on the base substrate of FIG. 3;

FIG. 5 is a cross-sectional view of FIG. 4 having a gate insulating layer formed thereon;

FIG. 6 is a plan view of FIG. 3 having an activation layer formed thereon;

FIG. 7 is a cross-sectional view of FIG. 6;

FIG. 8 is a cross-sectional view of FIG. 7 having a primitive metal layer formed on the activation layer and the gate insulation layer;

FIG. 9 is a plan view of FIG. 6 having data wiring formed on the gate insulation layer and an oxidation-blocking layer; and FIG. 10 is a cross-sectional view of one of the four TFT's shown in FIG. 9.

DETAILED DESCRIPTION OF THE INVENTION

Figure 1:
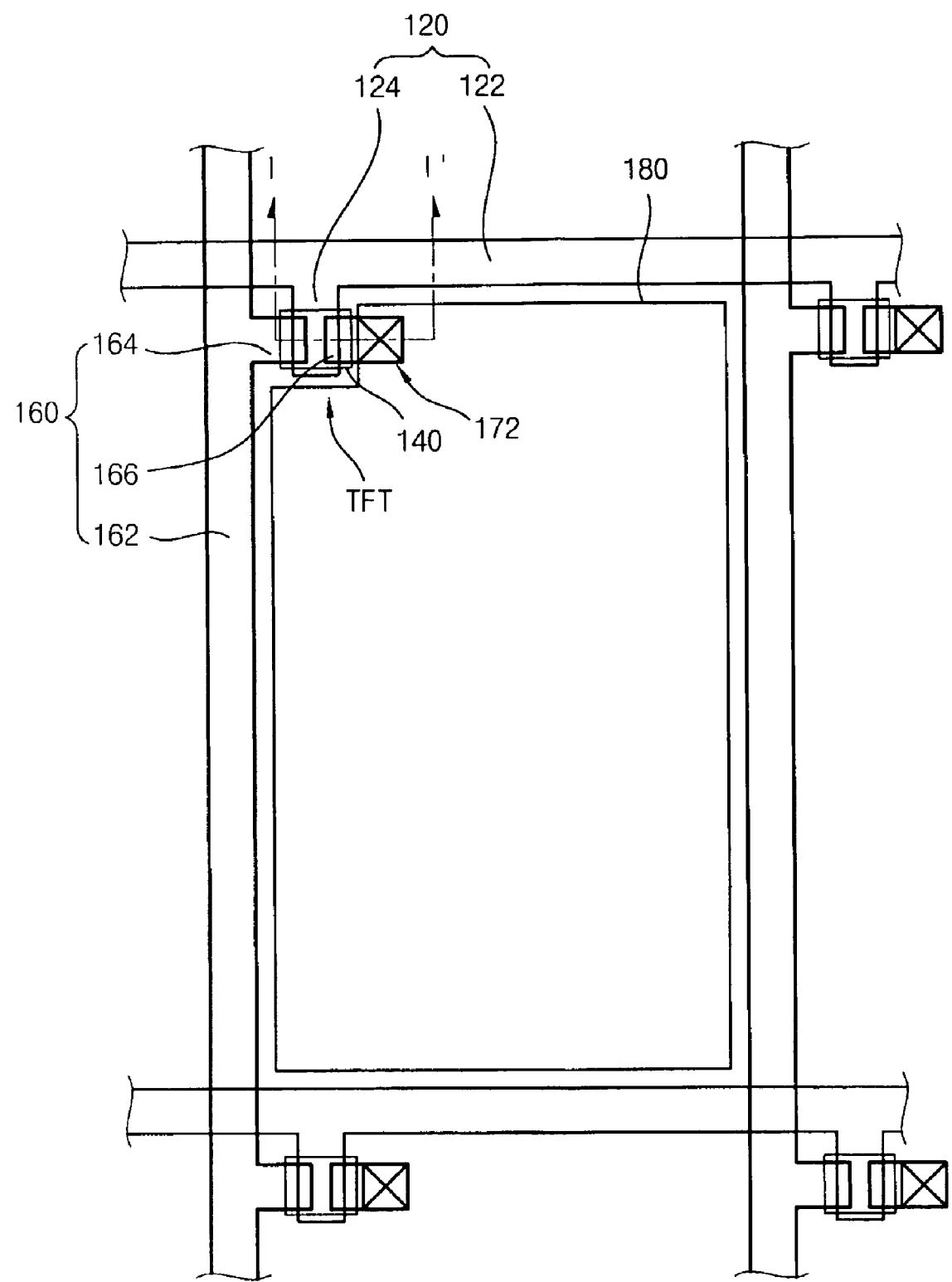
FIG. 1 is a plan view layout illustrating an exemplary embodiment of a TFT substrate according to the present invention.

It should be understood that the exemplary embodiments of the present invention described below may be varied or modified in many different ways without departing from the inventive principles disclosed herein, and the scope of the present invention is therefore not limited to these particular following exemplary embodiments. Rather, these embodiments are provided so that this disclosure will be thorough and complete, and will fully convey the concept of the invention to those skilled in the art by way of example and not of limitation.

Like numbers refer to like elements throughout. In the figures, the thickness of certain lines, layers, components, elements or features may be exaggerated for clarity. The terminology used herein is for the purpose of describing particular exemplary embodiments only and is not intended to limit the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

Hereinafter, the exemplary embodiments of the present invention will be described in detail with reference to the accompanied drawings.

Figure 2:
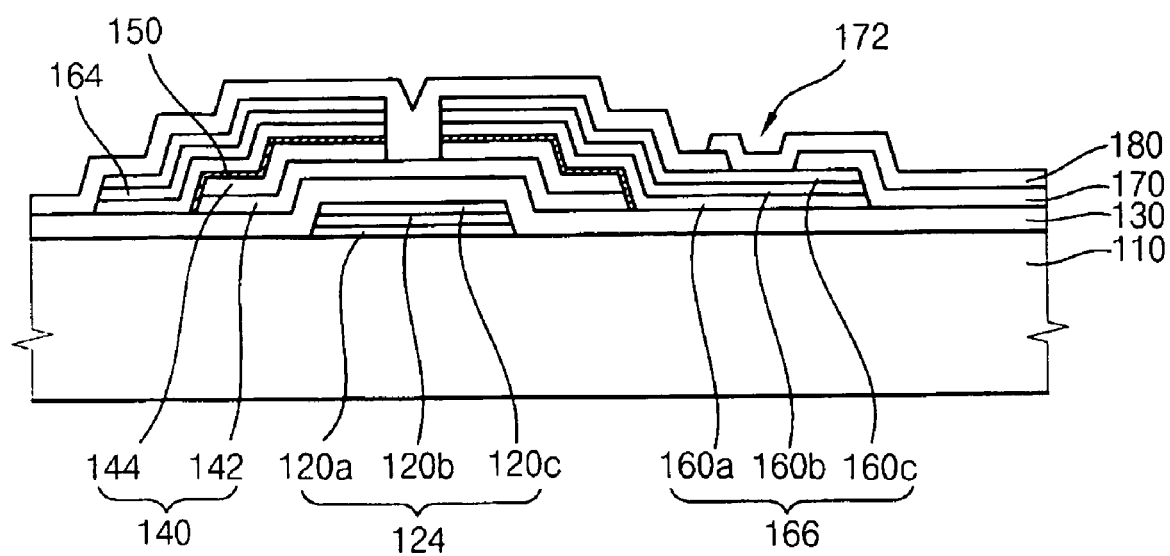
FIG. 2 is a cross-sectional view taken along a line I-I' in FIG. 1.

FIG. 1 is a plan view layout illustrating an exemplary embodiment of a TFT substrate according to the present invention, and FIG. 2 is a cross-sectional view taken along a line I-I' in FIG. 1.

Referring to FIGS. 1 and 2, a thin film transistor (TFT) substrate according to an exemplary embodiment of the present invention includes a base substrate 110, a gate wiring 120, a gate insulation layer 130, an activation layer 140, an oxidation-blocking layer (or oxidation preventing layer) 150 and a data wiring 160.

The base substrate 110 may include an optically transparent material. For example, a glass substrate may be employed as the base substrate 110.

The gate wiring 120 is formed on the base substrate 110. The gate wiring 120 includes a gate line 122 and a gate electrode 124 electrically connected to the gate line 122. The gate line 122 is extended along a first direction, and the gate electrode 124 extends from the gate line 122 in a second direction substantially perpendicular to the first direction. The gate electrode 124 corresponds to one of electrodes of the TFT.

The gate wiring 120, including the gate line 122 and the gate electrode 124, has a three-layered structure. In detail as best seen with reference to FIG. 2, the gate wiring 120 includes a first gate wiring layer 120a, a second gate wiring layer 120b and a third gate wiring layer 120c. The second gate wiring layer 120b is formed on the first gate wiring layer 120a, and the third gate wiring layer 120c is formed on the second gate wiring layer 120b.

The first gate wiring layer 120a includes an oxide having indium ("In"). The first gate wiring layer 120a includes, for example, indium tin oxide ("ITO"), indium zinc oxide ("IZO"), etc. The first gate wiring layer 120a enhances an adhesiveness of the gate wiring 120 to the base substrate 110. The first gate wiring layer 120a has a thickness of about no more than about 500 angstroms ("Å").

The second gate wiring layer 120b includes silver ("Ag") or silver alloy. The second gate wiring layer 120b corresponds to an electric signal path.

The third gate wiring layer 120c includes an oxide having indium ("In"). The third gate wiring layer 120c includes, for example, indium tin oxide ("ITO"), indium zinc oxide ("IZO"), etc. The third gate wiring layer 120c protects the second gate wiring layer 120c from etching solution that is used for a subsequent process of manufacturing the TFT substrate. The third gate wiring layer 120c has a thickness of about no more than about 100 angstroms ("Å").

The gate insulation layer 130 is formed on the base substrate 110 having the gate wiring 120 formed thereon. The gate insulation layer 130 includes, for example, silicon nitride ("SiN$_x$") or silicon oxide ("SiO$_x$").

The activation layer 140 is formed on a region of the gate insulation layer 130 and is disposed in a vicinity of the gate electrode 124. The activation layer 140 includes a semiconductor layer 142 and an ohmic contact layer 144. The ohmic contact layer 144 is formed on the semiconductor layer 142. The semiconductor layer 142 includes, for example, amorphous silicon ("a-Si"). The ohmic contact layer 144 includes, for example, amorphous silicon having n-type dopant ("n+ a-Si").

The oxidation-blocking layer 150 is formed on the activation layer 140, and more particularly, is formed on the ohmic contact layer 144 of the activation layer 140. The oxidation-blocking layer 150 prevents chemical reaction between the oxygen in the data wiring 160 and the activation layer 140. In particular, the oxidation-blocking layer 150 prevents chemical reaction between the oxygen in source and drain electrodes 164 and 166, respectively, of the data wiring 160 and the silicon of the activation layer 140 to enhance the characteristics of the TFT. The oxidation-blocking layer 150 includes, for example, silicide. In other words, a silicide layer may be employed as the oxidation-blocking layer 150. In order to form the silicide layer, a primitive metal layer is formed on the ohmic contact layer 144. After the metal of the primitive metal layer is reacted with the silicon of the ohmic contact layer 144 to form the silicide layer, the other primitive metal layer, except for the silicide layer, is removed by an etching process, for example.

The primitive metal layer includes, for example, titanium ("Ti"), chromium ("Cr"), molybdenum ("Mo"), nickel ("Ni"), tantalum ("Ta"), cobalt ("Co"), magnesium ("Mg"), vanadium ("V"), tungsten ("W") or a mixture thereof. The metal layer except for the suicide layer is removed by, for example, a dry etching process or a wet etching process. The oxidation-blocking layer 150 has a thickness of about 10 angstroms to about 5000 angstroms ("Å").

The data wiring 160 is formed on the gate insulation layer 130 and the oxidation-blocking layer 150. The data wiring 160 includes a data line 162, a source electrode 164 and a drain electrode 166. As best seen with reference to FIG. 1, the data line 162 is extended along the second direction. In other words, the data line 162 is substantially perpendicular to the gate line 122. The source electrode 164 extends from the data line 162 in the first direction, so that the source electrode 164 is electrically connected to the data line 162. The drain electrode 166 is separated from the source electrode 164, and the drain electrode 166 faces the source electrode 164. The source and drain electrodes 164 and 166 are disposed opposite to one another relative to the gate electrode 124 therebetween. The gate, source and drain electrodes 124, 164 and 166, respectively, and the activation layer 140 form the TFT.

The data wiring 160, including the data line 162, the source electrode 164 and the drain electrode 166, has a three-layered structure having a first data wiring layer 160a, a second data wiring layer 160b and a third data wiring layer 160c. The second data wiring layer 160b is formed on the first data wiring layer 160a, and the third data wiring layer 160c is formed on the second data wiring layer 160b.

The first data wiring layer 160a includes an oxide having indium ("In"). The first data wiring layer 160a includes, for example, indium tin oxide ("ITO"), indium zinc oxide ("IZO"), etc. The first data wiring layer 160a enhances an adhesiveness of the data wiring 160 to the gate insulation layer 130 and the oxidation-blocking layer 150. The first data wiring layer 160a has a thickness of no more than about 500 angstroms ("Å").

The second data wiring layer 160b includes silver ("Ag") or silver alloy. The second data wiring layer 160b corresponds to an electric signal path.

The third data wiring layer 160c includes an oxide having indium ("In"). The third data wiring layer 160c includes, for example, indium tin oxide ("ITO"), indium zinc oxide ("IZO"), etc. The third data wiring layer 160c protects the second data wiring layer 160b from an etching solution that is used in a subsequent process of manufacturing the TFT substrate. The third data wiring layer 160c has a thickness of about 100 angstroms ("Å").

The TFT substrate further includes a protection layer 170 and a pixel electrode 180. The protection layer 170 is formed on gate insulation layer 130 having the data wiring 160 formed thereon to cover the data wiring 160. The protection layer 170 includes a contact hole 172 that exposes a portion of the drain electrode 166.

The pixel electrode 180 is formed on the protection layer 170. The pixel electrode 180 is electrically connected to the drain electrode 166 through the contact hole 172. The pixel electrode 180 includes an optically transparent and electrically conductive material such as indium tin oxide ("ITO"), indium zinc oxide ("IZO"), etc.

Hereinafter, a method of manufacturing the TFT substrate according to an exemplary embodiment of the present invention will be explained. FIGS. 3 through 10 are plan views and cross-sectional views illustrating a process of manufacturing the TFT substrate in FIG. 2.

Figure 3:
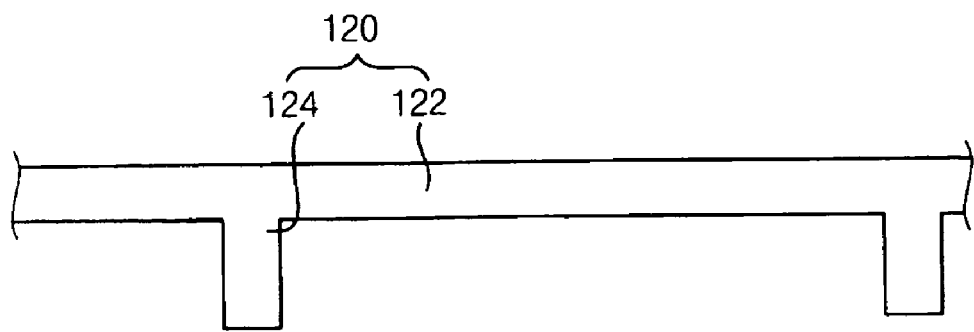
Figure 3:
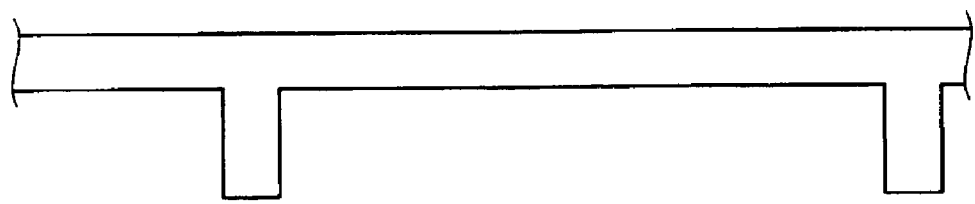
Figure 4:
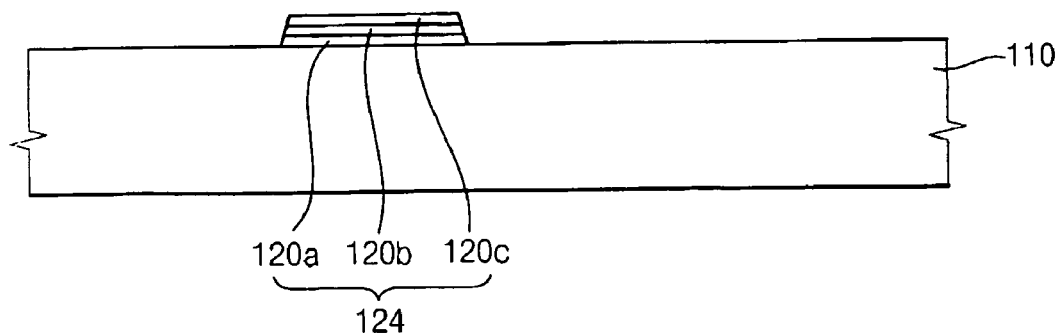

Referring to FIGS. 3 and 4, the first gate wiring layer 120a is formed on the base substrate 110, the second gate wiring layer 120b is formed on the first gate wiring layer 120a, and the third gate wiring layer 120c is formed on the second gate wiring layer 120b. The first, second and third gate wiring layers 120a, 120b and 120c are patterned, for example, by a photolithography process to form the gate wiring 120 having the gate line 122 and the gate electrode 124.

The first gate wiring layer 120a includes an oxide having indium ("In"). The first gate wiring layer 120a includes, for example, indium tin oxide ("ITO"), indium zinc oxide ("IZO"), etc. The first gate wiring layer 120a has a thickness of no more than about 500 angstroms ("Å").

The second gate wiring layer 120b includes silver ("Ag") or silver alloy. The second gate wiring layer 120b corresponds to a path for electric signals.

The third gate wiring layer 120c includes an oxide having indium ("In"). The third gate wiring layer 120c includes, for example, indium tin oxide ("ITO"), indium zinc oxide ("IZO"), etc. The third gate wiring layer 120c has a thickness of no more than about 100 angstroms ("Å").

Figure 5:
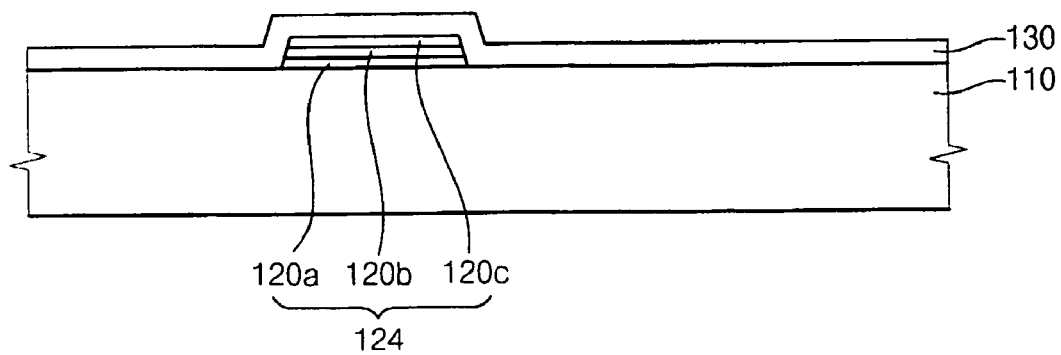

Referring to FIG. 5, the gate insulation layer 130 including, for example, silicon nitride ("SiN$_x$") or silicon oxide ("SiO$_x$") is formed on the base substrate 110 having the gate wiring 120 formed thereon.

Figure 6:
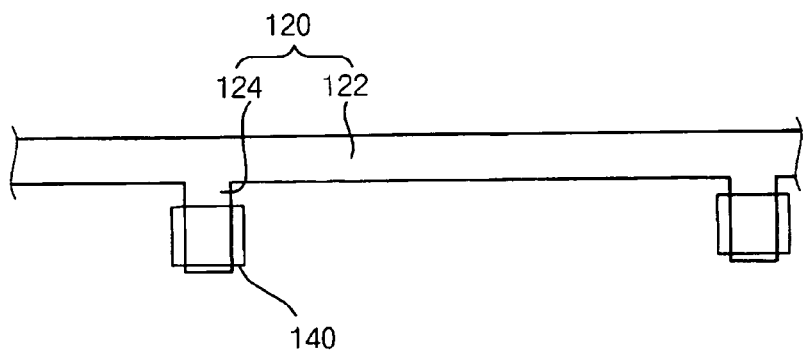
Figure 6:
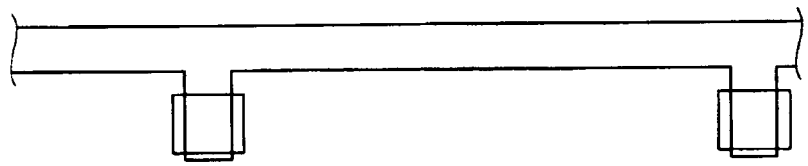
Figure 7:
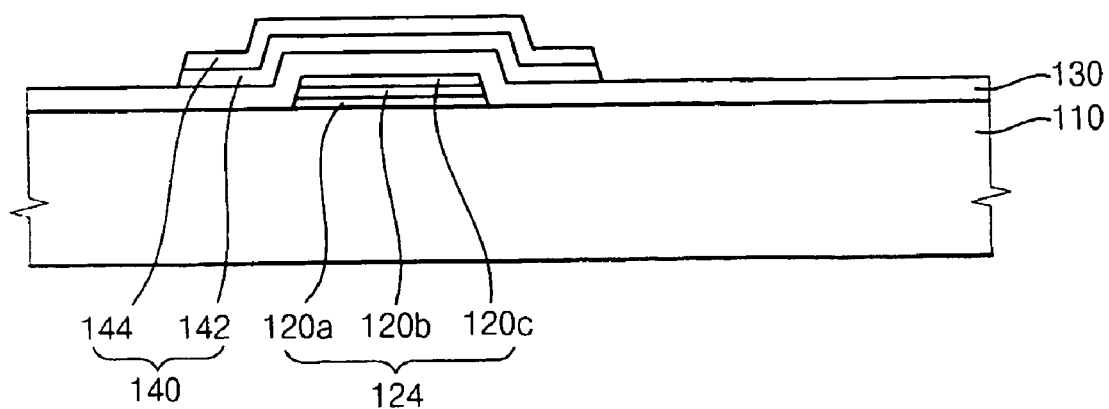

Referring to FIGS. 6 and 7, the semiconductor layer 142 is formed on the gate insulation layer 130, and the ohmic contact layer 144 is formed on the semiconductor layer 130. The semiconductor layer 142 and the ohmic contact layer 144 are patterned, for example, via a photolithography process to form the activation layer 140. The semiconductor layer 142 includes, for example, amorphous silicon ("a-Si"). The ohmic contact layer 144 includes, for example, an amorphous silicon having n-type dopant ("n+ a-Si").

Figure 8:
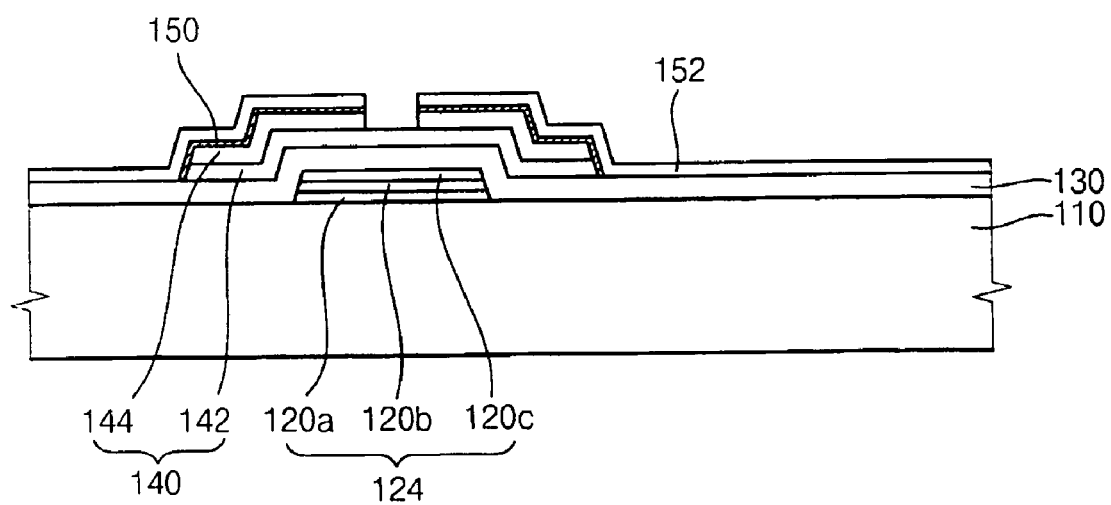

Referring to FIG. 8, the primitive metal layer 152 is formed on the activation layer 140 and the gate insulation layer 130 by a sputtering method, for example. The primitive metal layer 152 reacts with the silicon of the activation layer 140. The primitive metal layer 152 includes, for example, titanium ("Ti"), chromium ("Cr"), molybdenum ("Mo"), nickel ("Ni"), tantalum ("Ta"), cobalt ("Co"), magnesium ("Mg"), vanadium ("V"), tungsten ("W") or a mixture thereof.

Metal of the primitive metal layer 152 reacts with the silicon of the ohmic contact layer 144 to form the oxidation-blocking layer 150. The oxidation-blocking layer 150 prevents chemical reaction between the oxygen in the source and drain electrodes 164 and 166, respectively, and the silicon in the ohmic contact layer 144 to enhance the characteristics of the TFT In forming the oxidation-blocking layer 150, a heating process may be performed. The heating process is performed at a temperature of about 500° C. for no more than about one hour, and then the oxidation-blocking layer 150 is formed having a thickness of about 10 angstroms to about 5000 angstroms ("Å").

After the oxidation-blocking layer 150 is formed, the primitive metal layer 152 is removed. The primitive metal layer 152 may be removed through a dry etch process or a wet etch process. When the primitive metal layer 152 is removed, only the oxidation-blocking layer 150 remains on the ohmic contact layer 144.

Figure 9:
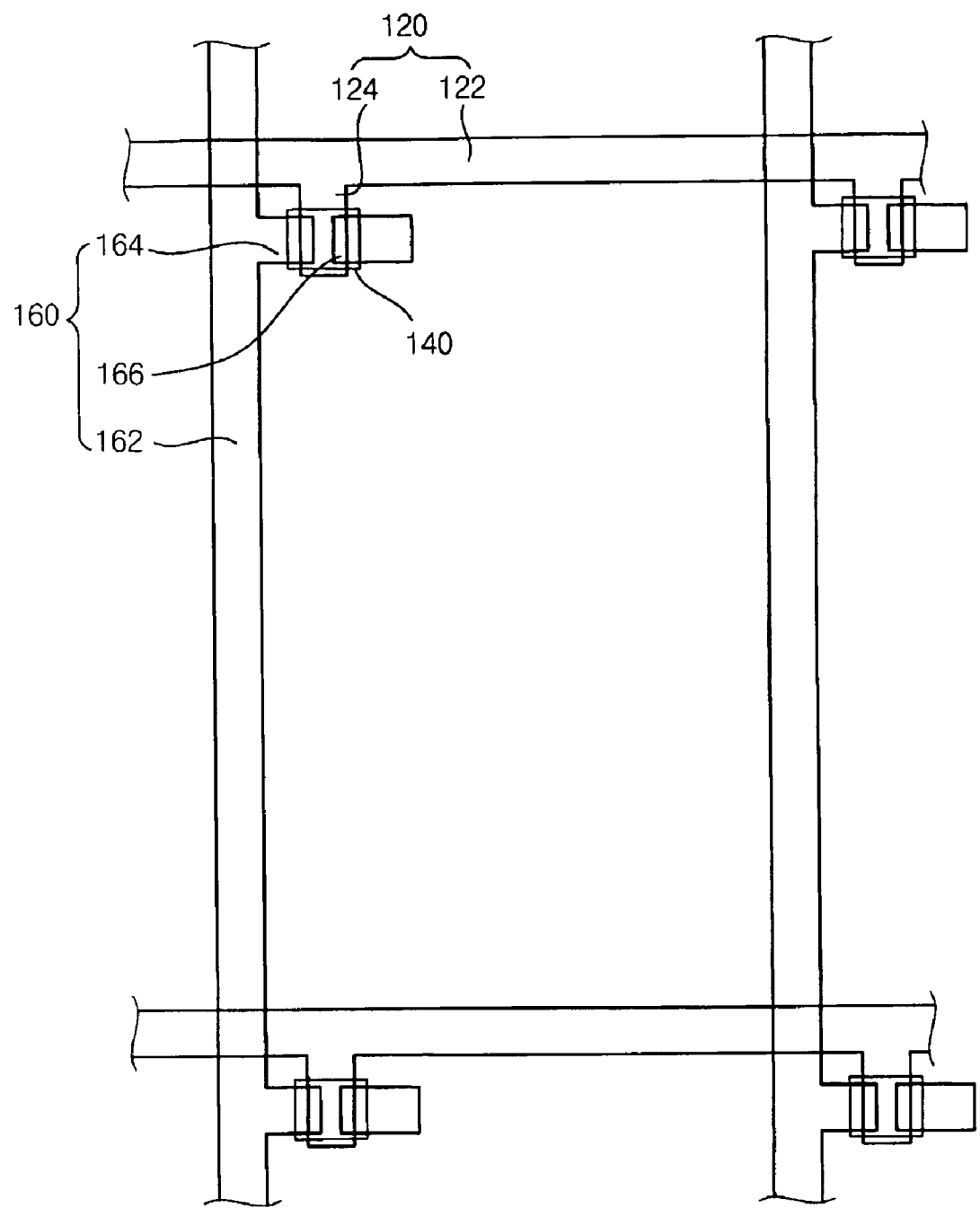
Figure 10:
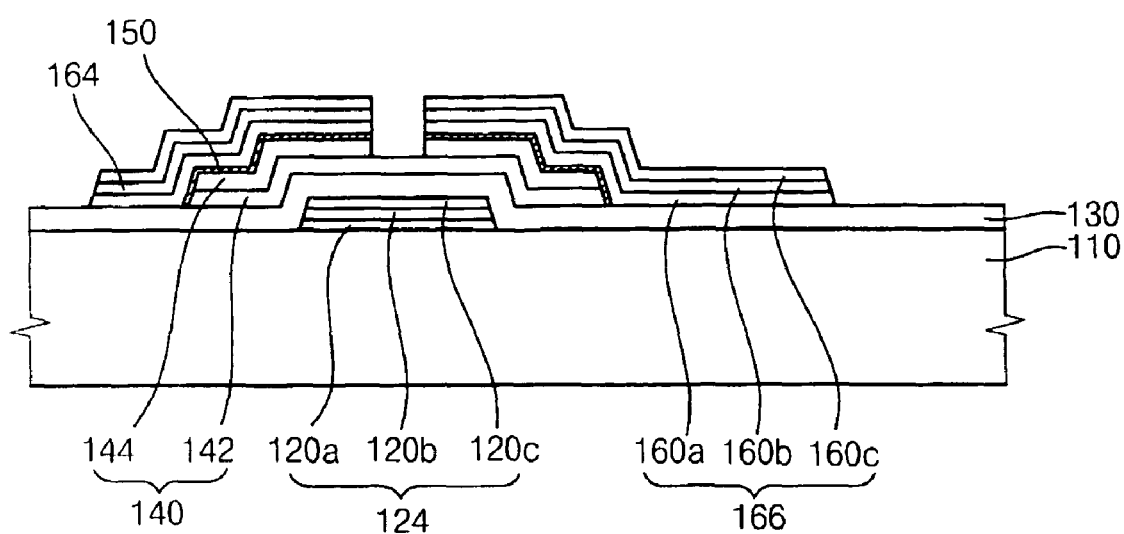

Referring to FIGS. 9 and 10, the first data wiring layer 160a is formed on the gate insulation layer 130 and the oxidation-blocking layer 150. The second data wiring layer 160b is formed on the first data wiring layer 160a, and the third data wiring layer 160c is formed on the second data wiring layer 160b. The first, second and third data wiring layers 160a, 160b and 160c are etched to form the data wiring 160 including the data line 162, the source electrode 164 and the drain electrode 166. The data line 162 extends along the second direction substantially normal to the first direction. In other words, the data line 162 is substantially perpendicular to the gate line 122 extending in the first direction. As best seen with reference to FIG. 9, the source electrode 164 extends from the data line 162 along the second direction substantially perpendicular to the first direction. The drain electrode 166 is separated from the source electrode 164. The source electrode 164 faces the drain electrode 166, and the source and drain electrodes 164 and 166 are disposed opposite to one another relative to the gate electrode 124 therebetween.

The first data wiring layer 160a includes an oxide having indium ("In"). The first data wiring layer 160a includes, for example, indium tin oxide ("ITO"), indium zinc oxide ("IZO"), etc. The first data wiring layer 160a enhances an adhesiveness of the data wiring 160 to the gate insulation layer 130 and the oxidation-blocking layer 150. The first data wiring layer 160a has a thickness of no more than about 500 angstroms ("Å").

The second data wiring layer 160b includes silver ("Ag") or silver alloy. The second data wiring layer 160b corresponds to a path for electric signals.

The third data wiring layer 160c includes an oxide having indium ("In"). The third data wiring layer 160c includes, for example, indium tin oxide ("ITO"), indium zinc oxide ("IZO"), etc. The third data wiring layer 160c protects the second data wiring layer 160b from etching solution that is used in a subsequent process for manufacturing the TFT substrate. The third data wiring layer 160c has a thickness of about 100 angstroms ("Å").

The oxidation-blocking layer 150 and the ohmic contact layer 144 that are not covered by the data wiring 160 are etched to separate the ohmic contact layer 144 and to expose the semiconductor layer 142.

Referring again to FIGS. 1 and 2, the protection layer 170 is formed on the data wiring 160 and the gate insulation layer 130. The protection layer 170 includes inorganic material. The protection layer 170 is then patterned to form the contact hole 172. The contact hole 172 may have a polygonal cross-sectional shape. Alternatively, the contact hole 172 may have a circular cross-sectional shape.

Then, an optically transparent and electrically conductive layer (not shown) is formed on the protection layer 170. The optically transparent and electrically conductive layer includes, for example, indium tin oxide ("ITO"), indium zinc oxide ("IZO"), etc. The optically transparent and electrically conductive layer formed on the protection layer 170 is patterned to form the pixel electrode 180. The pixel electrode 180 is electrically connected to the drain electrode 166 through the contact hole 172.

In the present exemplary embodiment, both of the gate and data wirings 120 and 160, respectively, have the three-layered structure of ITO/Ag/ITO. Alternatively, only one of the gate and data wirings 120 and 160, respectively, may have the three-layered structure.

EXPERIMENTAL EXAMPLE

In accordance with an exemplary method as described in FIGS. 3 through 10, a TFT substrate was prepared. More specifically, the TFT substrate included the oxidation layer 150 and the gate and data wirings 120 and 160, respectively, each having a three-layered structure of ITO/Ag/ITO.

Comparative Example 1

In accordance with a conventional method, a TFT substrate was prepared, as known in the art. In particular, the TFT substrate included no oxidation layer, but included the gate and data wirings 120 and 160, respectively, each having a three-layered structure of ITO/Ag/ITO.

Comparative Example 2

In accordance with another conventional method known in the art, a TFT substrate was prepared. In detail, the TFT substrate included no oxidation layer, but included the gate and data wirings 120 and 160, respectively, each having a three-layered structure of Mo/Al/Mo.

An experimental result of a higher on-current ("$I_{on}$"), a lower off-current ("$I_{off}$") and an electric resistivity ("Rd") is shown in the following Table 1.

TABLE 1

|  | Experimental Example | Comparative Example 1 | Comparative Example 2 |
|---|---|---|---|
| $I_{on}$ (μA) | 4.38 | 3.83 | 5.18 |
| $I_{off}$ (pA) | 0.55 | 277.4 | 0.51 |
| Vth (V) | 2.30 | 1.57 | 2.51 |
| Rd (kΩ) | 0.89 | 1.03 | 1.07 |

Referring to Table 1, the TFT substrate of the Experimental Example has a higher on-current ("$I_{on}$"), and a lower off-current ("$I_{off}$") than the TFT substrate of the Comparative Example 1. The TFT substrate of the Experimental Example has substantially same on-current ("$I_{on}$"), and off-current ("$I_{off}$") as those of the conventional TFT substrate of the Comparative Example 2.

However, the TFT substrate of the Experimental Example has a lower electric resistivity ("Rd") than the conventional TFT substrate of the Comparative Example 2.

According to the present invention, the gate and data wirings have a three-layered structure having a first indium tin oxide ("ITO") layer, a silver ("Ag") layer formed on the first indium tin oxide layer, and a second indium tin oxide ("ITO") layer formed on the silver layer, so that electrical resistivity ("Rd") is lowered.

Additionally, an oxidation-blocking layer including silicide is formed between the ohmic contact layer and the data wiring, so that the on-current ("$I_{on}$") is lowered for turning the TFT on and the off-current ("$I_{off}$") is raised for turning the TFT off.

Having described the exemplary embodiments of the present invention and its advantages, it is noted that various changes, substitutions and alterations can be made herein by one of ordinary skill in the art without departing from the spirit and scope of the invention as defined by appended claims.

What is claimed is:

1. A thin film transistor (TFT) substrate comprising:
a base substrate;
a gate wiring formed on the base substrate, the gate wiring including a gate line extending along a first direction and a gate electrode electrically connected to the gate line;
a gate insulation layer formed on the base substrate to cover the gate wiring;
an activation layer formed on the gate insulation layer;
an oxidation-blocking layer formed on the activation layer;
a data wiring including a data line extending along a second direction substantially perpendicular to the first direction, a source electrode is electrically connected to the data line and a drain electrode separated from the source electrode, the source and drain electrodes being disposed on the oxidation-blocking layer;
a protection layer covering the data wiring, the protection layer having a contact hole exposing a portion of the drain electrode; and
a pixel electrode formed on the protection layer and electrically connected to the drain electrode through the contact hole,
wherein at least one of the gate wiring and data wiring includes a three layered structure including a first wiring layer, a third wiring layer, and a second wiring layer intermediate the first and third wiring layers, the first and third wiring layers comprise indium oxide.

2. The TFT substrate of claim 1, wherein the oxidation-blocking layer comprises metal silicide.

3. The TFT substrate of claim 2, wherein the metal silicide is selected from the group consisting of titanium silicide, chromium silicide, molybdenum silicide, nickel silicide, tantalum silicide, cobalt silicide, magnesium silicide, vanadium silicide and tungsten silicide.

4. The TFT substrate of claim 2, wherein the oxidation blocking layer has a thickness of about 10 angstroms to about 5000 angstroms ("Å").

5. The TFT substrate of claim 1, wherein the data wiring includes the three layered structure and the second wiring layer includes silver.

6. The TFT substrate of claim 5, wherein the first and third wiring layers comprise indium tin oxide (ITO).

7. The TFT substrate of claim 5, wherein the first and third wiring layers comprise indium zinc oxide (IZO).

8. The TFT substrate of claim 1, wherein the gate wiring includes the three layered structure and the second wiring layer includes silver.

9. The TFT substrate of claim 8, wherein the first and third wiring layers comprise indium tin oxide (ITO) or indium zinc oxide (IZO).

10. The TFT substrate of claim 1, wherein the activation layer comprises:
a semiconductor layer including amorphous silicon (a-Si); and
an ohmic contact layer including an n-type dopant doped amorphous silicon (n+a-Si).

11. A thin film transistor (TFT) substrate comprising:
a base substrate;
a gate wiring formed on the base substrate, the gate wiring including a gate line extending along a first direction and a gate electrode electrically connected to the gate line;
a gate insulation layer formed on the base substrate to cover the gate wiring;
an activation layer formed on the gate insulation layer;
a silicide layer formed on the activation layer;
a data wiring including a data line extending along a second direction substantially perpendicular to the first direction, a source electrode electrically connected to the data line and a drain electrode separated from the source electrode, the source and drain electrodes being disposed on the oxidation-blocking layer, the data wiring having a first data wiring layer including indium oxide, a second data wiring layer being formed on the first data wiring layer and including silver, and a third data wiring layer being formed on the second data wiring layer and including indium oxide;

a protection layer covering the data wiring, the protection layer having a contact hole exposing a portion of the drain electrode; and a pixel electrode formed on the protection layer and electrically connected to the drain electrode through the contact hole.

* * * * *